(12) United States Patent
Mcgilvray et al.

(10) Patent No.: US 7,739,994 B2
(45) Date of Patent: Jun. 22, 2010

(54) THERMOELECTRIC SYSTEM FOR AN ENGINE

(75) Inventors: Andrew N. Mcgilvray, East Peoria, IL (US); John T. Vachon, Peoria, IL (US); William E. Moser, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 613 days.

(21) Appl. No.: 11/803,402

(22) Filed: May 14, 2007

(65) Prior Publication Data

US 2008/0072948 A1 Mar. 27, 2008

Related U.S. Application Data

(63) Continuation-in-part of application No. 11/520,107, filed on Sep. 13, 2006, now Pat. No. 7,287,506.

(51) Int. Cl.
*F02F 1/42* (2006.01)

(52) U.S. Cl. .............................. 123/193.5; 123/41.82 R

(58) Field of Classification Search .......... 123/41.82 R, 123/193.5, 195 R
See application file for complete search history.

(56) References Cited

FOREIGN PATENT DOCUMENTS

JP           63111268 A    *    5/1988

\* cited by examiner

*Primary Examiner*—Noah Kamen
(74) *Attorney, Agent, or Firm*—Shital A. Shah; Caterpillar Inc.

(57) ABSTRACT

An internal combustion engine that includes a block, a cylinder head having an intake valve port and exhaust valve port formed therein, a piston, and a combustion chamber defined by the block, the piston, and the head. At least one thermoelectric device is positioned within either or both the intake valve port and the exhaust valve port. Each of the valves is configured to move within a respective intake and exhaust valve port thereby causing said valves to engage the thermoelectric devices resulting in heat transfer from the valves to the thermoelectric devices. The intake valve port and exhaust valve port are configured to fluidly direct intake air and exhaust gas, respectively, into the combustion chamber and the thermoelectric device is positioned within the intake valve port, and exhaust valve port, such that the thermoelectric device is in contact with the intake air and exhaust gas.

19 Claims, 7 Drawing Sheets

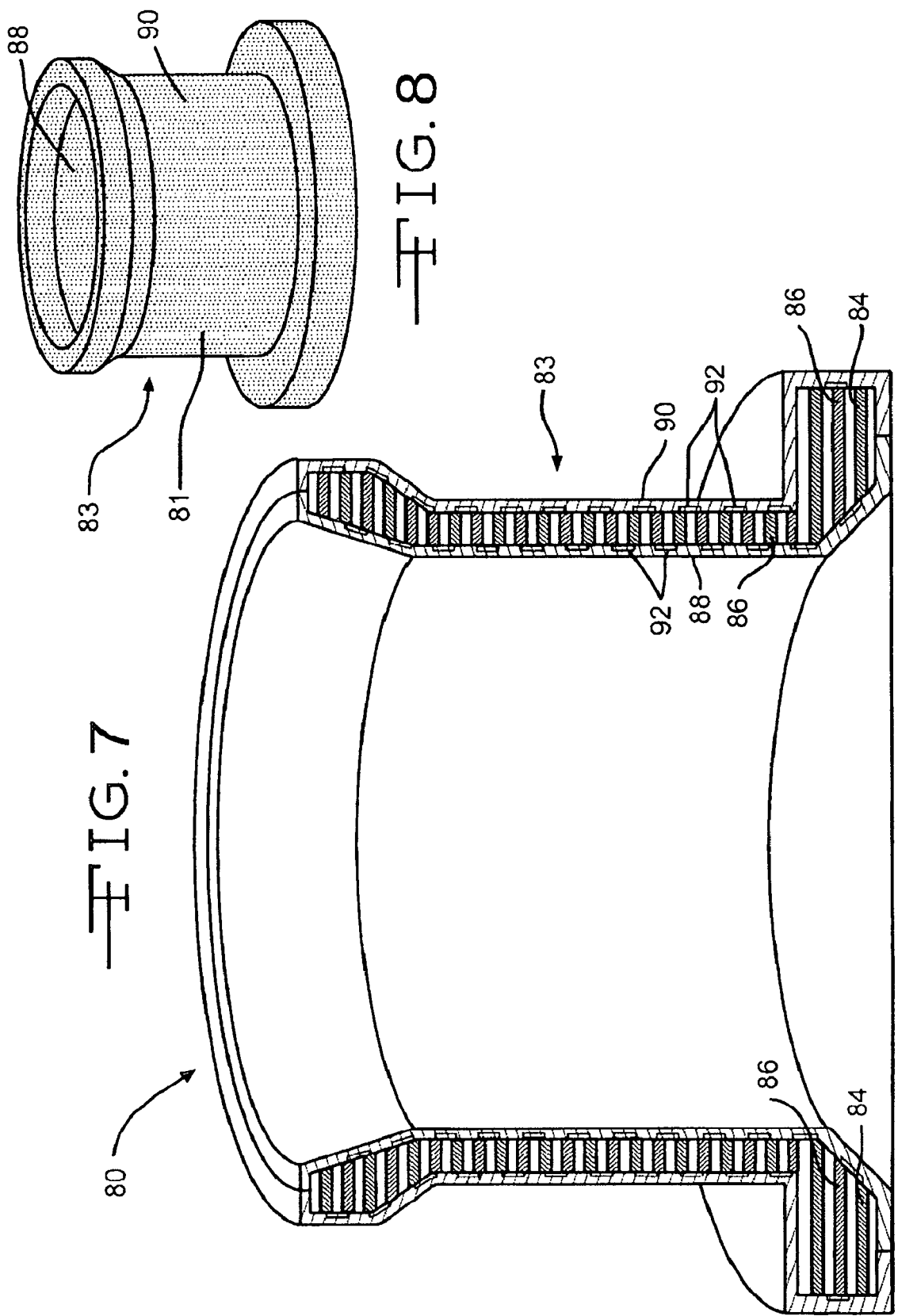

THERMOELECTRIC SYSTEM FOR AN ENGINE

CROSS REFERENCE TO RELATED APPLICATIONS

This application is a continuation-in-part application of U.S. patent application Ser. No. 11/520,107, filed on Sep. 13, 2006, the benefit of priority from which is herein claimed, and the disclosures of which are incorporated herein by reference in their entirety.

U.S. GOVERNMENT RIGHTS

This invention was made with government support under the terms of DE-FC26-04NT42280 awarded by the Department of Energy. The government may have certain rights in this invention.

TECHNICAL FIELD

The present disclosure relates to a thermoelectric system for generating electrical power. In particular, the present disclosure relates to thermoelectric devices disposed within the head of an internal combustion engine.

BACKGROUND

Internal combustion engines have become an integral component of many cultures throughout the world, providing a means of transportation and power generation while improving people's work productivity, generally. Over the years, researchers have improved many aspects of engine technology. Despite these many advances, unfortunately, engines only operate at about 50% efficiency or lower.

Poor engine efficiency is largely attributable to thermal energy lost during the combustion process. Much of this waste heat is conducted through various engine components and transferred to the environment, providing no useful work whatsoever.

In an effort to improve the efficiency of combustion engines, researchers have developed ways to convert some of the waste heat into useful energy. For example, some researchers have converted waste heat into useful electrical energy that can be used to supplement a portion of the engine's electrical loads.

One such way is disclosed in U.S. Pat. No. 6,029,620 to Zinke ("Zinke"). Zinke discloses an engine block containing thermoelectric materials that generate a direct current during operation and, in so doing, provides for at least some of the necessary engine cooling requirements and for at least some of the electric power requirements. Zinke discloses manufacturing internal combustion engines out of thermocouple-type materials. Zinke also discloses attaching thermoelectric modules to the exterior of an engine for minimizing the redesign of internal engine components.

Thermoelectric devices may either convert electrical energy into thermal energy or thermal energy into electrical energy. Early 19th century scientist Thomas Seebeck discovered the phenomenon of placing a temperature gradient across the junctions of two dissimilar conductors resulted in the flow of electrical current.

The engines disclosed in Zinke, unfortunately, fail in several respects. First, thermoelectric materials do not generally share the same material characteristics as the iron alloys used in engine block and head castings. As a result, an engine composed entirely of thermoelectric materials may exceed design limitations or fail to be robust enough for practical use. Additionally, the cost of thermoelectric materials is generally considerably higher than those of iron alloys. As a result, an engine composed entirely of thermoelectric materials would be prohibitively expensive.

Furthermore, Zinke fails to disclose precise locations for placing these thermoelectric materials. Zinke simply discloses either making an engine entirely out of thermoelectric materials or, in the alternative, generally attaching thermoelectric materials to the engine block. Simply attaching thermoelectric materials to an engine block, without anything further, fails to provide a practical solution for recovering waste heat.

The present disclosure is aimed at overcoming one or more of the shortcomings set forth above.

SUMMARY OF THE INVENTION

An internal combustion engine that includes a block, a cylinder head having an intake valve port and exhaust valve port formed therein, a piston, and a combustion chamber defined by the block, the piston, and the head is disclosed. At least one thermoelectric device is positioned within either or both the intake valve port and the exhaust valve port. Each of the valves is configured to move within a respective intake and exhaust valve port thereby causing said valves to engage the thermoelectric devices resulting in heat transfer from the valves to the thermoelectric devices. The intake valve port and exhaust valve port are configured to fluidly direct intake air and exhaust gas, respectively, into the combustion chamber and the thermoelectric device is positioned within the intake valve port, and exhaust valve port, such that the thermoelectric device is in contact with the intake air and exhaust gas.

A cylinder head positioned proximate a combustion chamber of an internal combustion is also disclosed. The cylinder head includes a coolant channel configured to receive cooling fluid, at least one intake valve port and at least one exhaust valve port formed in the cylinder head, the intake and exhaust valve ports including valve seats adapted to receive intake valves and exhaust valves, and thermoelectric devices positioned around the valve seats.

BRIEF DESCRIPTION OF THE DRAWINGS

FIG. 7 is an enlarged partial sectional view of the thermoelectric device according to the embodiment shown in FIGS. 5 and 6.

FIG. 8 is a diagrammatic illustration of an alternate embodiment of a thermoelectric device according to an embodiment of the disclosure.

DETAILED DESCRIPTION

Figure 1:
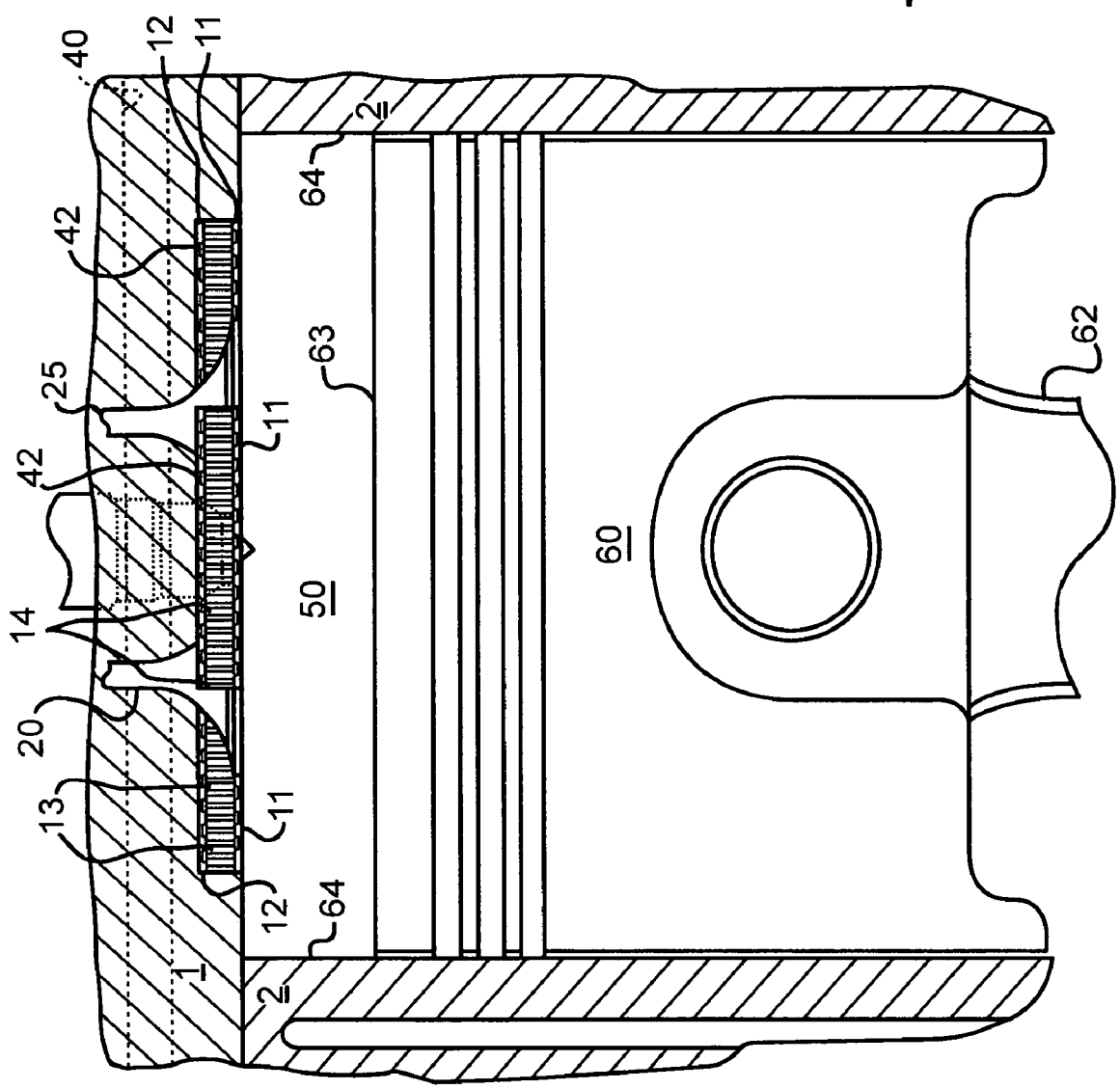
FIG. 1 is a diagrammatic illustration of a thermoelectric device arrangement within a portion of an engine according to an embodiment of the disclosure.

FIG. 1 provides a diagrammatic illustration of a plurality of thermoelectric devices 10 positioned within a cylinder head 1 of an internal combustion engine. In the illustrated embodiment, the engine is a reciprocating-piston internal combustion engine, with a piston 60 that reciprocates within a cylinder 64 formed within an engine block 2. The topside 63 of the piston 60, the bottom side of the cylinder head 1, and the cylinder 64 define a combustion chamber 50 formed within the engine block 2. Combustion of a fuel and air mixture occurs within the combustion chamber 50, generating high temperatures as a result of the heat release associated with the combustion. Much of this heat is transferred to the cylinder head 1, the piston 60, the block 2, and other components of the engine.

The heat transferred to these components typically performs no useful work and consequently decreases the overall efficiency of the engine. In an effort to improve engine efficiency, thermoelectric devices 10 are arranged within the cylinder head 1. The thermoelectric devices 10 convert some of this wasted heat energy into useful electrical energy, which can later be used to supplement the engine's electrical loads, for example. As previously mentioned, electrical energy is produced from thermal energy under the phenomenon known as the Seebeck effect.

When a temperature gradient is imposed on a conductor under open circuit conditions—that is, no current is allowed to flow—a steady-state potential difference between the high- and low-temperature regions is created. In a closed circuit, on the other hand, electrical current will flow as long as the temperature gradient is maintained. The power density produced by this temperature gradient is proportional to the temperature gradient and defined by the following equation:

$$Q'' = \frac{\lambda \Delta T}{L}$$

Q" defines power density, or power per unit area. L defines the distance between the hot surface 11 and the cold surface 12 (see FIG. 4) and λ defines the thermal conductivity of the thermoelectric device 10. As can be seen, the larger the temperature gradient, the larger the power generated.

In the embodiments illustrated in the Figures, the thermoelectric devices are positioned within the cylinder head 1 of the engine so that the thermoelectric devices are located in areas where a large thermal gradient exists between the areas. One such embodiment includes positioning the thermoelectric devices 10 between an engine coolant channel 40 and the combustion chamber 50. Between these locations, a large temperature gradient is generally observed since liquid coolant flows through the coolant channel 40. In some instances, this temperature gradient may be as high as 650° C.

The Figure of Merit, ZT, of a material at a given temperature T is used to describe the material's performance or effectiveness when used in a thermoelectric device, such as the device 10. The Figure of Merit is defined by the following equation:

$$ZT = \frac{S^2 T}{RK}$$

S defines the Seebeck coefficient of the thermoelectric device 10, R defines the electrical resistance of the thermoelectric device 10, K defines the thermal conductance of the material, and T defines the temperature. The higher the Figure of Merit, the better the performance of the thermoelectric device 10. In some embodiments of the present disclosure, the Figure of Merit can be three. Nanostructured boron carbide, for example, is a material that exhibits a Figure of Merit of at least three including at the temperatures commonly associated with internal combustion engine operation.

Figure 3:
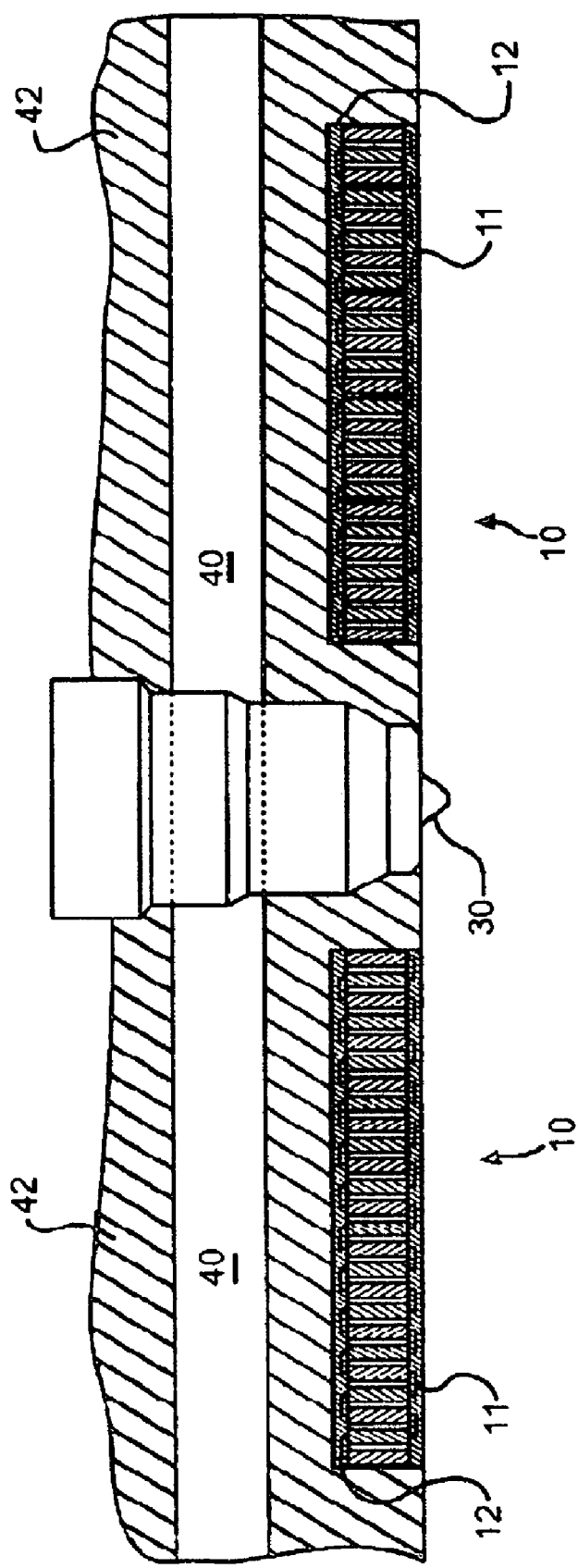
FIG. 3 is a cross-sectional view of the diagrammatic illustration of FIG. 2.
Figure 4:
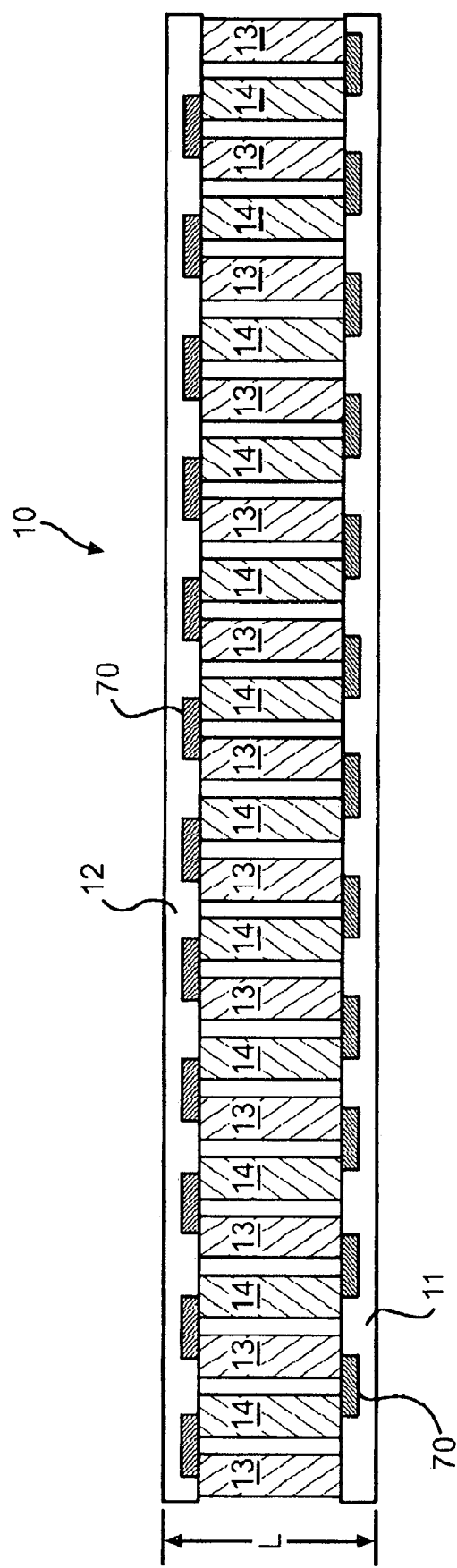
FIG. 4 is a cross-sectional view of a thermoelectric device according to an embodiment of the disclosure.

As shown in FIG. 4, an embodiment of the thermoelectric device 10 is shown. The reader should appreciate that the present disclosure is not limited to the particular thermoelectric devices 10 shown in FIGS. 1-4. Instead, one skilled in the art would understand that several different types of thermoelectric devices 10 might alternatively be used to practice the invention disclosed herein.

The thermoelectric devices 10 shown in FIGS. 1-4 comprise two ceramic substrates that serve as a foundation and electrical insulation for P-type semiconductors 14 and N-type semiconductors 13. These semiconductors 13 and 14 are connected electrically in series and thermally in parallel between the ceramics. The ceramic substrates also serve as insulation between the internal electrical elements. In this particular embodiment, a heat sink is in contact with hot side 11 and a cooler surface is in contact with cold side 12. An electrically conductive material, such as conducting pads attached to the P-type semiconductors 14 and the N-type semiconductors 13, maintain electrical connections inside the thermoelectric device 10. Solder or any other known fixing technique may be used at the connection joints to enhance the electrical connections and hold the thermoelectric device 10 together.

In some embodiments, P-type semiconductors 14 comprise compounds or boron and/or silicon. N-type semiconductors 13, on the other hand, may comprise SiC or SiGe, for example.

In some embodiments, the electrical leads 70 to the thermoelectric devices 10 are attached to pads on the hot side 11 of the thermoelectric device 10. The leads 70 may then be connected to a DC battery, DC loads, or a DC-AC inverter for powering any AC loads, for example. The reader should appreciate that as electrical power is generated, the electric power may be applied to any useful mechanism envisioned by one skilled in the art and is not limited to those listed above.

The embodiment shown in FIG. 1 depicts the thermoelectric devices 10 positioned within the cylinder head 1 so that a hot side 11 of the thermoelectric devices 10 faces the combustion chamber 50. The highest temperatures within an engine typically occur within the combustion chamber 50, and can be as high as 750° C. or higher.

Additionally and as further illustrated in the embodiment shown in FIG. 1, the cold side 12 of the thermoelectric device 10 faces away from the combustion chamber 50 and faces towards the coolant channel 40. In one particular embodiment, the cooling fluid in coolant channel 40 is engine jacket water that has been previously cooled by an engine cooler, such as a radiator. Because the electrical power generated by the thermoelectric devices 10 is proportional to the temperature gradient, it may be desirable to configure the coolant system of the engine (not shown) so that a lower temperature portion of the coolant flows through the coolant channel 40.

Figure 2:
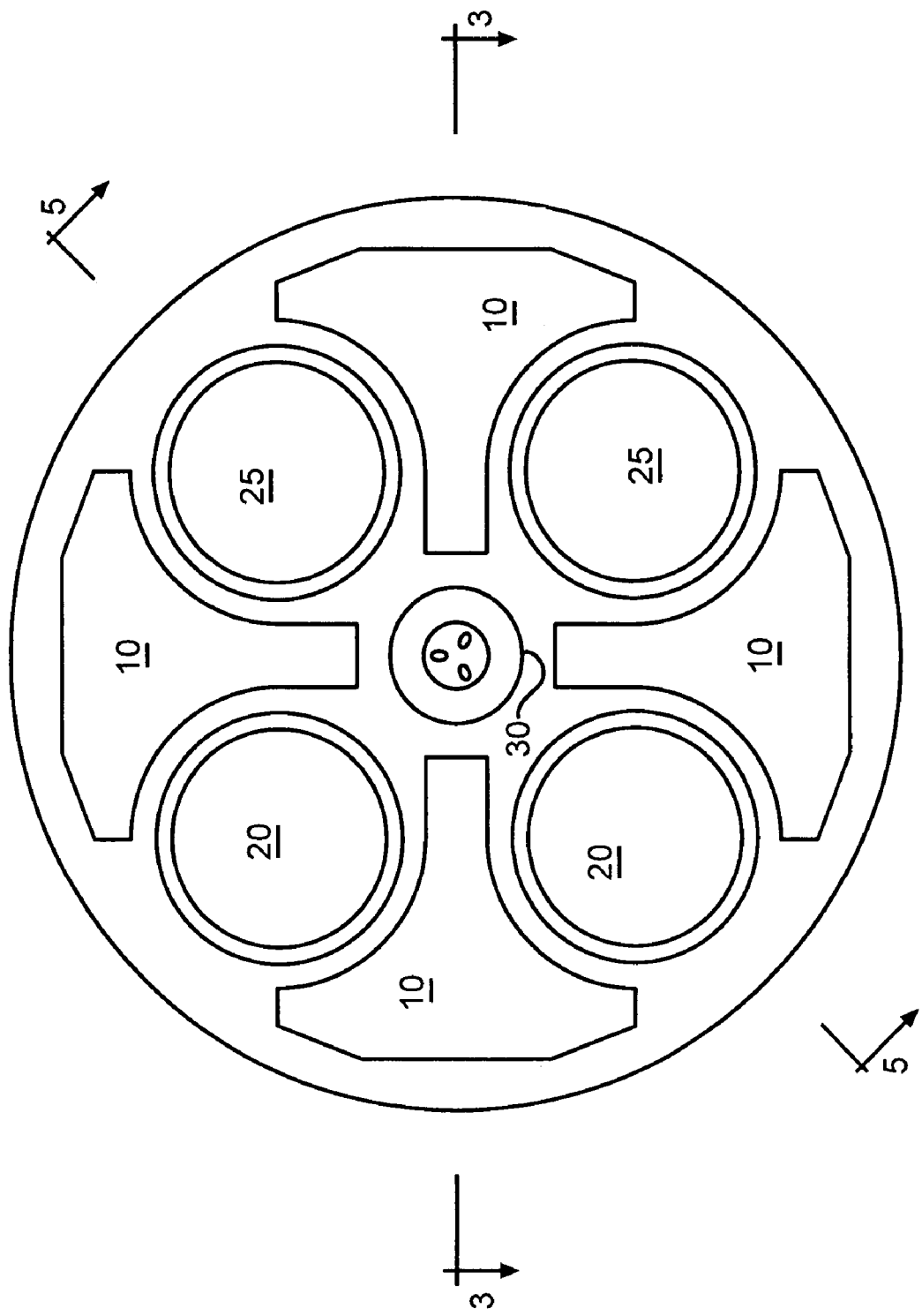
FIG. 2 is a diagrammatic illustration of a thermoelectric device arrangement within a cylinder head according to the embodiment of the disclosure shown in FIG. 1.

Now referring to FIG. 2, there is shown a diagrammatic illustration of a plurality of thermoelectric devices 10 positioned within an engine's cylinder head 1. The particular embodiment of FIG. 2 depicts four thermoelectric devices 10 positioned around two intake valves 20 and two exhaust valves 25. Many engines have two intake valves 20 and two exhaust valves 25 per cylinder 64. Although the particular embodiment of FIG. 2 depicts two intake valves 20 and two exhaust valves 25 per cylinder 64, the reader should appreciate that the present disclosure applies to engines with other valve configurations. In addition, although intake valves 20 and exhaust valves 25 are shown as having similar diameters, the reader should appreciate that many internal combustion engines have intake valves 20 and exhaust valves 25 with varying diameters and that the present disclosure would apply to these engines, as well.

Now referring to FIG. 3, a cross-sectional view along line 1-1 of part of the engine cylinder head 1 that is depicted in FIG. 2 is shown. As can be seen more clearly in FIG. 3, the thermoelectric devices 10 have a hot side 11 and a cold side 12. In this particular embodiment, the hot side 11 is in direct contact with the combustion chamber 50, while the cold side 12 faces the coolant channel 40. As can also be seen, a metallic interface 42 exists to separate the coolant channel 40 from the thermoelectric devices 10. As shown, the metallic interface 42 is integrally formed with the cylinder head 1.

Referring again to FIG. 4, the thermoelectric device 10 comprises two opposed ceramic substrates that serve as a foundation and electrical insulation for a plurality of P-type 14 and N-type 13 semiconductors. The semiconductors 13 and 14 are connected electrically in series, and thermally in parallel between the ceramic substrates. The ceramic substrates may also serve as insulation between the internal electrical elements and a heat sink that may be in contact with the hot side 11 as well as a cooler object against the cold side 12. The electrical connections between the P-type 14 and the N-type 13 semiconductors may be achieved by the use of metallic leads 70, or tabs, which may have components made from nickel or chromium. Nickel, for example, is a material with good conductivity and oxidation resistance properties.

Figure 5:
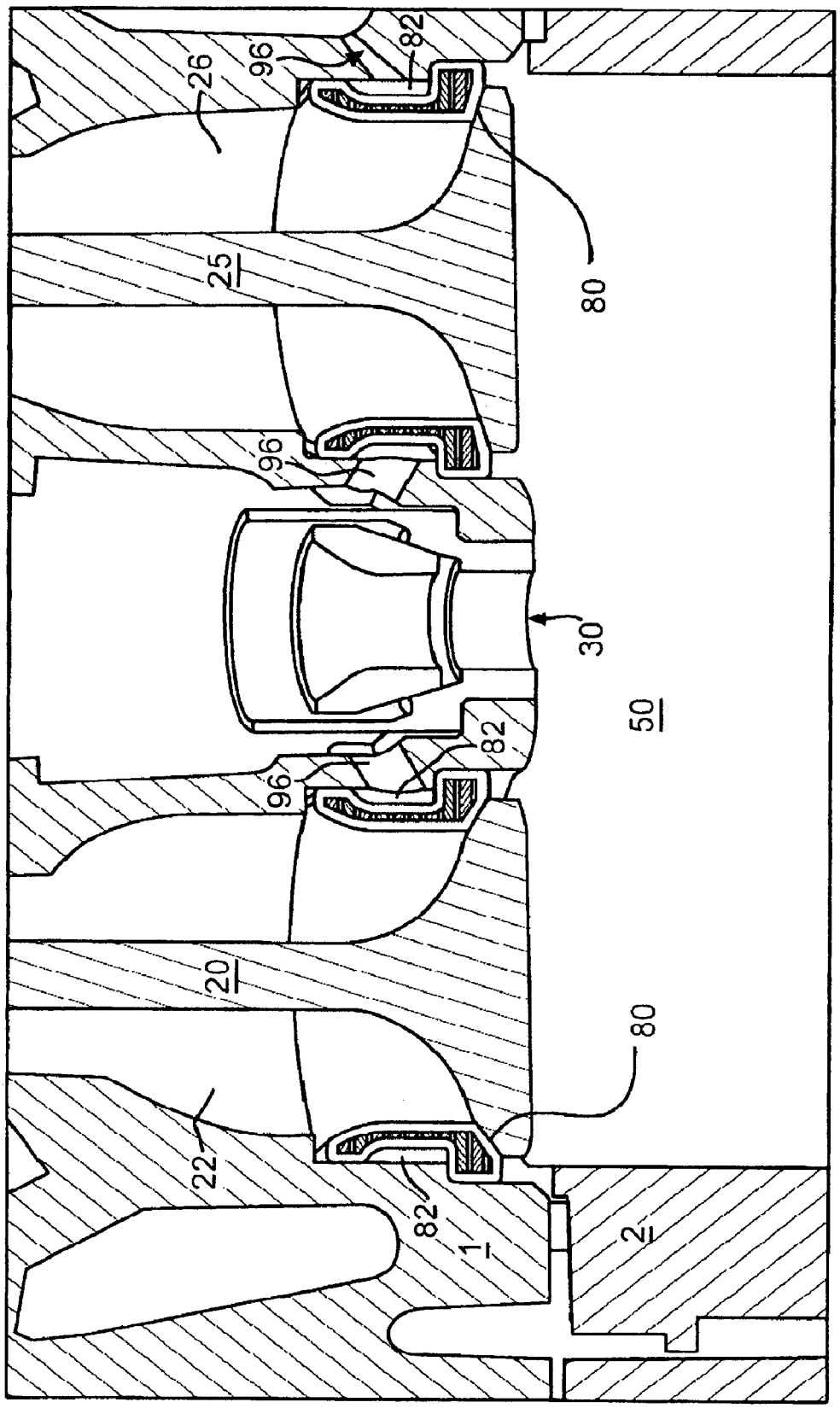
FIG. 5 is a diagrammatic illustration of a thermoelectric device arrangement within a portion of an engine according to an embodiment of the disclosure.

Illustrated in FIG. 5 is a sectional view through Line 5-5 of FIG. 2 depicting an alternate embodiment of a thermoelectric device 80. The thermoelectric devices 80 according to the present embodiment function in a substantially similar manner to the thermoelectric devices 10 shown and described above. As with the devices 10 shown above, the thermoelectric devices 80 convert some of the wasted heat energy of the engine into useful electrical energy, which can be used to provide supplemental power for electrical loads that are placed on the engine.

Figure 6:
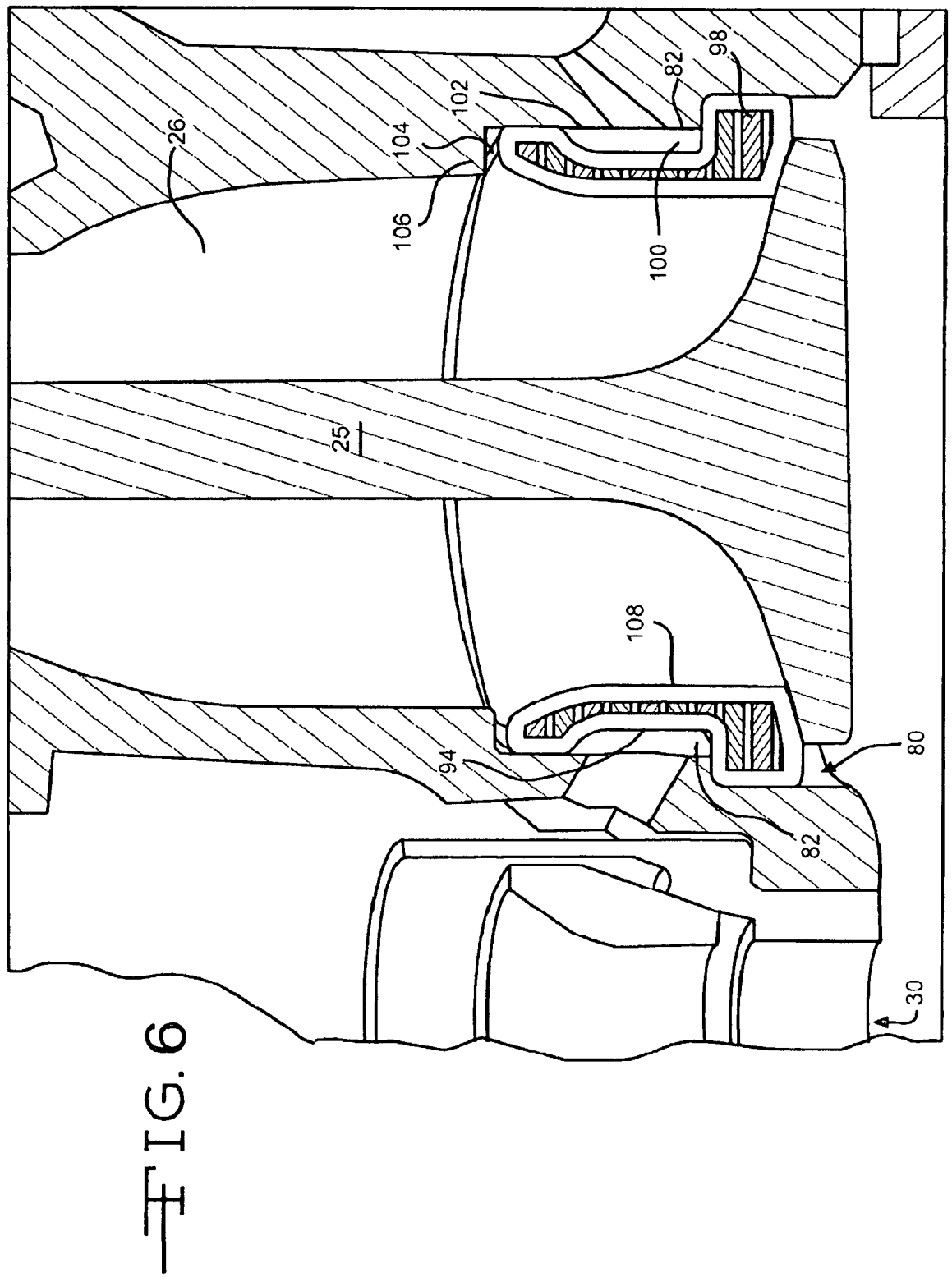
FIG. 6 is an enlarged view of the thermoelectric device arrangement shown in FIG. 5.

In the embodiments illustrated in FIGS. 5-7, a plurality of the thermoelectric devices 80 are positioned within the cylinder head 1 of the engine so that the thermoelectric devices 80 are located between two areas where a large thermal gradient is present during engine operation. As shown in FIG. 5, the thermoelectric devices 80 act as valve seat inserts that are positioned within intake valve ports 22 and exhaust valve ports 25. As such, the thermoelectric devices 80 are positioned between a coolant channel 82 and the respective ports 22, 26.

During routine engine operations, a large temperature gradient is generally observed between these locations. Typically, a significant amount of heat is transferred during the combustion process to the intake valves 20 and the exhaust valves 25. As the valves 20, 25 move within the respective intake and exhaust valve ports 21, 26, the valves 20, 25 engage the thermoelectric devices 80. Therefore, much of this heat is transferred to the valve seat insert (in the form of the thermoelectric devices 80) by contact between the two components. As the thermoelectric device 80 draws heat away from the valves 20, 25, a large temperature gradient will be observed between the hot side 88 of the thermoelectric device 80 and the cold side 90 of the device 80 (as can be most clearly seen in FIGS. 7-8). It should be appreciated that the terms engage and contact as used herein are not meant to imply that direct contact between the valves 20, 25 and the thermoelectric devices 80 is required. A substantial heat transfer between these components can be achieved by their relative proximity within the intake valve ports 21 and exhaust valve ports 26 within the cylinder head 1.

Generally, a larger temperature gradient will also be observed between the exhaust valve ports 26 and the coolant channel 82 due to exhaust gas temperatures being higher than intake air temperatures. However, it is likely that there will exist some temperature gradient between the intake valve ports 22 and the coolant channel 82.

FIG. 5 provides a diagrammatic illustration of a plurality of thermoelectric devices 80 positioned within the cylinder head 1 of an engine. The illustrated embodiment depicts the thermoelectric devices 80 positioned around the intake valve 20 and the exhaust valve 25. Many engines have two intake valves 20 and two exhaust valves 25 per cylinder 64. Although FIG. 2 depicts two intake valves 20 and two exhaust valves 25 per cylinder 64, and the view in FIG. 5 shows only one of the intake valve 20 and one of the exhaust valve 25, the reader should appreciate that the present disclosure applies to engines with other valve configurations. In addition, although the intake valves 20 and the exhaust valves 25 are shown as having similar diameters, the reader should appreciate that many internal combustion engines have intake valves and exhaust valves with varying diameters and that the present disclosure would apply to these engines, as well.

Illustrated in FIGS. 6 and 7 is an enlarged sectional view of the thermoelectric device 80 positioned within the cylinder head 1, and separately, to show the details of the thermoelectric device 80 in greater detail. It should be appreciated that the present disclosure is not limited to the particular thermoelectric devices 80 shown in FIGS. 5-6. Instead, one skilled in the art would understand that several different types of thermoelectric devices 80 might be used to practice the invention disclosed herein. For example, as shown in FIG. 8, a thermoelectric coating 81 could be applied to a valve seat insert 83 to produce the desired thermoelectric effect described above.

The thermoelectric device 80 shown in FIGS. 5-7 comprises two ceramic substrates that serve as a foundation and electrical insulation for N-type semiconductors 84 and P-type semiconductors 86. These semiconductors 84 and 86 are connected electrically in series and thermally in parallel between the ceramics. The ceramic substrates also serve as insulation between the internal electrical elements. In this particular embodiment, a heat sink is in contact with hot side 88 and a cooler surface is in contact with cold side 90. An electrically conductive material, such as conducting pads attached to P-type semiconductors 86 and N-type semiconductors 84, maintain electrical connections inside the thermoelectric device 80. Solder or any other known fixing technique may be used at the connection joints to enhance the electrical connections and hold the thermoelectric device 80 together.

In some embodiments, the P-type semiconductors 86 may include compounds or boron and/or silicon. N-type semiconductors 84, on the other hand, may comprise SiC or SiGe, for example, as was described above.

In the illustrated embodiment, electrical leads 92 to the thermoelectric device 80 are attached to pads on the hot side 88 of the thermoelectric device 80. The leads 92 may then be connected to a DC battery, DC loads, or a DC-AC inverter for powering any AC loads, for example. It should be appreciated that as electrical power is generated, the application of the power may go towards any useful mechanism envisioned by one skilled in the art and is not limited to those listed above.

To facilitate this connection, and as shown in FIG. 6, wires 94 for conducting the electric signal to power any of the loads described above can extend through the coolant channels 82 and various other cooling conduits 96, described in greater detail below, that can be found within the cylinder head 1.

The embodiment shown in FIGS. 5-6 depicts the thermoelectric devices 80 positioned within the intake valve port 22 and exhaust valve port 26 so that a hot side 88 of the thermoelectric devices 80 face the inner portions of the intake and exhaust valve ports 22, 26. The highest surface temperatures within an engine generally occur within the combustion chamber 50, and can be as high as 750° C. or higher. Gas temperatures are likely to be even higher. A substantial amount of heat is transferred from the combustion chamber 50 to the intake valves 20 and exhaust valves 25. The gases that result from combustion will exhaust from the combustion chamber 50 via the exhaust valve port 26, thereby transporting some of that heat with the exhaust.

Additionally and as further depicted in FIGS. 5-6, the cold side 90 of the thermoelectric devices 80 face away from the inner portions of the intake and exhaust valve ports 22, 26, and face towards the coolant channel 82. The cooling fluid in the coolant channel 82 is engine jacket water that is previously cooled by an engine cooler, such as a radiator. Because the electrical power generated by the thermoelectric devices 80 is proportional to the temperature gradient, it may be desirable to configure the coolant system of the engine (not shown) so that a lower temperature portion of the coolant flows through the coolant channel 82.

The thermoelectric devices 80 can be separated from the coolant by a coating or other interface material on the outer surface of the cold side 90 of the thermoelectric device 80 thereby providing a barrier to prevent the thermoelectric device 80 from directly contacting the coolant within the coolant channel 82. Alternatively, there could be a thin wall or other interface structure (not shown) that is used to separate the coolant from the cold side 90 of the thermoelectric device 80. Such a structure would allow the coolant to cool the cold side 90 of the thermoelectric device, while maintaining the separation of the thermoelectric device 80 from the coolant. Additionally, in order to protect the thermoelectric devices 80 as they are positioned within the intake and exhaust valve ports 22, 26, the thermoelectric devices can include an interface (not shown) about the exterior of the device 80 that would exist to separate the intake air and exhaust gas, respectively, from the thermoelectric devices 80. Such an interface would also act to separate the intake valve 20 and the exhaust valve 25 from direct contact with the thermoelectric devices 80. It can be appreciated that the interface can be made of any material (such as metal, plastics, alloys, ceramics, or composites) that is suitable for providing protection to the devices 80 from the environmental conditions that are typically found within the engine cylinder head 1 and within the intake and exhaust valve ports 22, 26.

As was generally described above, a casting process may be used to manufacture the cylinder head 1. During this process, the intake valve port 22 and exhaust valve port 26 would be integrally formed within the cylinder head 1. Typically, during this casting process, space is created within the ports 22, 26 to accommodate valve seat inserts. As shown and described herein, the thermoelectric devices 80 can be used to replace valve seat inserts that are conventionally used. The reader should appreciate that the precise method of manufacturing is not germane to the disclosed embodiments and that one skilled in the art would understand that several methods might exist for manufacturing the cylinder head 1 with room to accommodate the thermoelectric devices 80.

Also formed during the casting process are water jackets and cooling conduits used by the coolant system of the engine to provide cooling fluid to the cylinder head and other engine components. As shown in FIGS. 5-6, the cooling conduits 94 are formed to supply water jackets with cooling fluid. The cooling conduits are also used to connect either a water jacket or a fluid supply to the coolant channel 82. As is known by those skilled in the art, the cooling fluid is jacket water (or any other coolant) that would have been previously cooled by an engine cooler, such as a radiator.

As shown in FIGS. 5-6, the coolant channel 82 is an annular ring that substantially encircles the thermoelectric devices 80. The annular ring is created as a result of the shape of the thermoelectric device 80 and its position within the intake valve port 22 and the exhaust valve port 26. As can be seen more clearly in FIG. 6, the thermoelectric device 80, positioned within the exhaust valve port 26, includes a first seat 98 that rests against a first step 100 formed on the inner surface 102 of the exhaust valve port 26. The thermoelectric device 80 also includes a second seat 104 that rests against a second step 106 formed on the inner surface 102 of the exhaust valve port 26. The thermoelectric device 80 will be press-fit into place within the exhaust valve port 26. Thus, the first step 100 and the second step 106 will act to hold the thermoelectric device 80 in place. The design of the thermoelectric device 80 also includes a partially curved (or otherwise shaped) body 108 extending between the first seat 98 and the second seat 104. The body 108 of the thermoelectric device 80, when positioned within the exhaust valve port 26, is separated from the inner surface 102 of the exhaust valve port 26, thereby creating an annular space. This annular space defines the coolant channel 82.

Although FIGS. 6-7 have been described primarily with respect to the thermoelectric device 80 being positioned in the exhaust valve port 26, it should be appreciated that the thermoelectric device 80 is positioned, and operates in a substantially similar manner, within the intake valve port 22. It should also be appreciated that the thermoelectric devices 80 is constructed and operates in a substantially similar manner to the thermoelectric devices 10 described above.

In some embodiments, metallic leads 70 may be connected to the ends of each semiconductor 13 or 14 leg by a conductive material that is applied at room temperature. When set, the conductive material may be capable of withstanding the high temperatures associated with engine combustion.

The electrical power developed by the thermoelectric devices 80 may be transferred to the point of use by wires 94—or any other type of electrical conductor known in the art. Referring to FIG. 6, a first wire 95 may connect a first semiconductor to the point of use and a second wire 97 may connect a second semiconductor to the point of use, which may be an electrical battery or load. As a temperature gradient is viewed across the thermoelectric device 80, an electrical potential will be generated and seen across the first and second wires.

INDUSTRIAL APPLICABILITY

The present disclosure provides a system and method for recovering waste heat from an internal combustion engine for converting it to useful electrical energy. Internal combustion engines convert chemical energy into useful work by the combustion of a fuel and air mixture.

During combustion of a fuel and air mixture within combustion chamber 50, heat is released causing the temperature within chamber 50 to rise. Much of this heat is thermally transferred to the valves 20, 25, the cylinder head 1, the piston 60, and the block 2. In some instances, the surface temperature may be as high as 750° C. The combustion gas pressures are then used to drive the piston 60 and the connecting rod 62 down (as seen in FIG. 1)—thus rotating a crankshaft (not shown) for the purpose of performing mechanical work.

Unfortunately, not all of the combusted fuel and air is converted into useful mechanical work. Some of the heat from the combustion process is thermally transferred to various engine components, such as the valves 20, 25, the cylinder head 1, the block 2, and the exhaust system (not shown). Much of the thermal energy is wasted as it transfers to the environment.

Referring to the embodiments shown in FIGS. 5-7, the disclosed system transfers some of this thermal energy to the hot side 88 of the thermoelectric device 80. In the illustrated embodiments, the hot side 88 of the thermoelectric device 80 is in direct contact with the intake and exhaust valves 20, 25, as well as intake air passing through the intake valve port 22 and combustion gases passing through the exhaust valve port 26. Therefore, the thermoelectric devices 80 are being exposed to the high temperatures resultant from the combustion process and ambient conditions within the engine. Additionally, as a result of the combustion process, the engine block 2 and cylinder head 1 will be exposed to high temperature conditions. Therefore, there will be some heat transfer from cylinder head 1 to the area around the thermoelectric devices 80, thereby also supplying a temperature gradient that will affect the performance of the thermoelectric devices 80.

During operation of the engine, engine coolant flows through the coolant channel 82. The relatively lower temperature coolant is in close proximity to the cold side 90 ceramic of the thermoelectric device 80 and is, therefore, generally much lower in temperature than the hot side 88. As a result, a temperature gradient will exist across the thermoelectric device 80. It is anticipated that the source of the coolant is the jacket-water cooler or radiator of the engine and therefore, the coolant will be cooler than the hot side 88 of the thermoelectric device 80.

As long as the temperature gradient is maintained, electrical current will flow. This electrical current may then be used to supplement a vehicle's electrical loads, charge a battery, or perform any other function requiring electricity.

In one embodiment, the electrical energy generated is used support the electrical load of a hybrid machine. Hybrid vehicles and machines typically have a combustion engine and electric motor mechanically linked to a drive train for providing propulsion. In this particular embodiment, the electrical energy generated by the thermoelectric device 80 would help power an electric motor via a generator or an alternator, which when mechanically linked to a drive train, provides propulsion to the machine.

It will be apparent to those skilled in the art that various modifications and variations can be made with respect to the embodiments disclosed herein without departing from the scope of the disclosure. Other embodiments of the disclosed invention will be apparent to those skilled in the art from consideration of the specification and practice of the materials disclosed herein. It is intended that the specification and examples be considered as exemplary only, with a true scope of the disclosure being indicated by the following claims and their equivalents.

What is claimed is:

1. An internal combustion engine, comprising:
    a block;
    a cylinder head having an intake valve port and exhaust valve port formed therein, each of the intake valve port and the exhaust valve port supporting a valve therein;
    a piston;
    a combustion chamber defined by the block, the piston, and the head; and
    at least one thermoelectric device positioned within at least one of the intake valve port and the exhaust valve port.

2. The engine defined in claim 1 wherein each of the valves is configured to move within a respective intake and exhaust valve port thereby causing said valves to engage the thermoelectric devices resulting in heat transfer from the valves to the thermoelectric devices.

3. The engine defined in claim 1 wherein the intake valve port is configured to fluidly direct intake air into the combustion chamber; and
    wherein the thermoelectric device is positioned within the intake valve port such that the thermoelectric device is in contact with the intake air.

4. The engine defined in claim 3 wherein the exhaust valve port is configured to fluidly direct exhaust gas from the combustion chamber; and
    wherein the thermoelectric device is positioned within the exhaust valve port such that the thermoelectric device is in contact with the exhaust gas.

5. The engine defined in claim 4 wherein the thermoelectric devices each comprise a cold side and a hot side, said cold side being substantially in direct contact with a cooling channel formed in the cylinder head and said hot side is in direct contact with the one of intake air and exhaust gas.

6. The engine defined in claim 1 further comprising a cooling system configured to provide cooling fluid to the cooling channel formed in the cylinder head.

7. The engine defined in claim 6 wherein the thermoelectric device is positioned between the cooling system and the one of intake air and exhaust gas.

8. The engine defined in claim 7 wherein the cooling system facing the cold side is from a downstream side of an engine radiator.

9. The engine defined in claim 1 wherein the thermoelectric device comprises a compound of boron or silicon.

10. The engine defined in claim 1 wherein the thermoelectric device comprises a thermoelectric coating.

11. The engine defined in claim 1 wherein the electrical energy generated by the thermoelectric device is configured to supplement electrical loads on the engine.

12. The engine defined in claim 1 further comprising two intake valve ports, two exhaust valve ports, and four thermoelectric devices, the four thermoelectric devices positioned within the intake and exhaust valve ports.

13. The engine defined in claim 1 wherein the thermoelectric device is a valve seat insert.

14. A hybrid machine, comprising:
    an electric motor;
    the engine of claim 1, said engine providing at least some electrical energy to said electrical motor via one of a generator and an alternator; and
    a drive train mechanically-linked to the motor and engine and adapted to provide propulsion to the machine.

15. A cylinder head positioned proximate a combustion chamber of an internal combustion engine comprising:
    a coolant channel configured to receive cooling fluid; and
    at least one intake valve port and at least one exhaust valve port formed in the cylinder head, the intake and exhaust valve ports including valve seats adapted to receive intake valves and exhaust valves, the valve seats being thermoelectric devices.

16. The cylinder head defined in claim 15 wherein the thermoelectric devices comprise a hot side and a cold side, said hot side facing away from the coolant channel and said cold side facing towards the coolant channel.

17. The cylinder head defined in claim 15 wherein the engine cylinder head comprises two intake valve seats and two exhaust valve seats per engine cylinder.

18. The cylinder head defined in claim 17 further comprising four thermoelectric devices per engine cylinder.

19. The cylinder head defined in claim 15 wherein the thermoelectric devices are substantially annularly shaped.

* * * * *